United States Patent [19]

Gotou et al.

[11] Patent Number: 4,636,968
[45] Date of Patent: Jan. 13, 1987

[54] METHOD OF POSITIONING A BEAM TO A SPECIFIC PORTION OF A SEMICONDUCTOR WAFER

[75] Inventors: Mineo Gotou, Kawasaki; Hirotsugu Wada, Tokyo, both of Japan

[73] Assignee: Kabushiki Kaisha Toshiba, Kawasaki, Japan

[21] Appl. No.: 625,545

[22] Filed: Jun. 28, 1984

[30] Foreign Application Priority Data

Jun. 30, 1983 [JP] Japan ................................. 58-119335

[51] Int. Cl.⁴ .................. G01B 11/27; G01N 23/223; G06F 15/60
[52] U.S. Cl. ................................ 364/559; 250/491.1; 356/401; 364/491
[58] Field of Search ...................... 250/491.1, 548, 557; 356/400, 401; 364/491, 559; 378/34

[56] References Cited

U.S. PATENT DOCUMENTS

| 4,328,553 | 5/1982 | Fredriksen et al. | 364/559 |
| 4,370,059 | 1/1983 | Masuda | 250/548 X |
| 4,423,959 | 1/1984 | Nakazawa et al. | 356/401 X |
| 4,433,243 | 2/1984 | Nakamura et al. | 250/491.1 X |
| 4,489,241 | 12/1984 | Matsuda et al. | 250/491.1 |
| 4,550,374 | 10/1985 | Meshman et al. | 356/401 X |
| 4,558,225 | 12/1985 | Gotou et al. | 250/491.1 |

Primary Examiner—Errol A. Krass
Assistant Examiner—Edward R. Cosimano
Attorney, Agent, or Firm—Oblon, Fisher, Spivak, McClelland & Maier

[57] ABSTRACT

A method of positioning a beam to a specific portion of a semiconductor wafer is disclosed. In this method, the positions of two positioning marks formed on the wafer are measured. The position of another of the marks is calculated. Then, an actual position of the mark is measured. The calculated position and the actual position are compared with each other. It is judged whether or not the mark satisfies a predetermined condition. When the mark satisfies the predetermined condition, the specific portion of the semiconductor wafer is determined using the actual position of the mark. When it does not satisfy the predetermined condition, the specific area is determined using the position calculated using the positions of the marks around the mark.

10 Claims, 10 Drawing Figures

METHOD OF POSITIONING A BEAM TO A SPECIFIC PORTION OF A SEMICONDUCTOR WAFER

BACKGROUND OF THE INVENTION

The present invention relates to an improvement in the method of positioning a beam to a specific portion of a semiconductor wafer, which is required in a semiconductor manufacturing process.

In semiconductor manufacturing processes, such as an electron beam exposure and an ion implantation, it is frequently required to position a specific area with high accuracy, for example, an area to be processed, at a predetermined location on the semiconductor wafer in the semiconductor manufacturing apparatus. The recent trend in this field is to increase micro-miniaturization and a high integration density of semiconductor integrated circuits. With this trend, the requirement for the positioning accuracy is more strict.

A lithography apparatus is used for effecting the electron beam exposure or the optical exposure. In this apparatus, it is necessary to position the semiconductor wafer at a predetermined position required in an optical system of the apparatus. For the positioning, the positions of positioning marks, previously formed on the semiconductor wafer, are measured. The measurement results are used for obtaining a parallel movement component and a rotating movement component of the required movement of the whole semiconductor wafer.

To improve the positioning accuracy of the semiconductor wafer, positioning marks are arrayed in a matrix fashion, for example. The positioning is made for each mark or for each chip area to be formed on the wafer. This approach can correct a dislocation of the wafer due to the distortion of the wafer caused during the manufacturing process. Types of defects of the positioning marks are classified into:

(a) The mark is not present.
(b) The mark is dislocated from its correct position.
(c) Dust is stuck to the mark or the mark is deformed with projected or chipped portions, so that the mark cannot be accurately measured.

Use of such defective marks brings about impossible positioning or inaccurate positioning of the semiconductor wafer. For example, the defective mark of the type (a) makes it impossible to position the semiconductor wafer. The defective mark of the type (b) or (c) makes the positioning inaccurate. Thus, the conventional positioning method can not provide an accurate positioning of the wafer when the defective mark is contained in the positioning marks. For example, the conventional positioning method makes it difficult to provide a fine pattern on any semiconductor chip with high precision. In this respect, the conventional positioning method involves the problem to be solved before attaining semiconductor devices improved in accuracy, integration density, production yield, and uniformity in the characteristics over the wafer surface.

SUMMARY OF THE INVENTION

Accordingly, an object of the present invention is to provide a method of positioning a beam exactly to a specific portion of a semiconductor wafer, which is required in a lithography process to manufacture semiconductor devices improved in accuracy, uniformity in characteristics, and production yield.

According to the present invention, there is provided a method of positioning a beam to a specific portion of a semiconductor wafer, having a plurality of positioning marks formed thereon to treat the wafer comprising:

a first step of detecting the positions of at least two predetermined positioning marks by radiating a beam thereto, calculting a position of a selected at least one of the positioning marks and detecting the actual position of the selected mark by radiating the beam thereto, a second step determining if the mark satisfies predetermined condition;

a third step of using the actual position of the selected mark as the reference position to position the beam to the specific portion of the wafer when the mark satisfies the conditions; and a fourth step of using the position of the mark, which is calculated from the positions of marks therearound as the reference position to position the beam to the specific portion of the wafer when the mark does not satisfies the conditions.

With such an arrangement, when the positioning mark is not a defective mark, the mark is directly used for the wafer positioning. When the positioning mark is a defective mark, the positions of the marks around the defective mark are measured. The measured positions of the marks are used for the wafer positioning. Thus, even if defective positioning marks are contained in the marks, an accurate positioning of the semiconductor wafer is ensured, improving the positioning accuracy. Therefore, the present invention attains many useful effects. The exposure process, for example, the electron beam exposure can be exactly performed, so that an accurate depiction of a fine pattern is possible. This greatly contributes to the improvement of integration density, accuracy, uniformity in characteristic, and production yield.

BRIEF DESCRIPTION OF THE DRAWINGS

FIGS. 8(a) and 8(b) show waveforms obtained when the defective mark is scanned at two positions by an electron beam.

DETAILED DESCRIPTION OF THE PREFERRED EMBODIMENTS

Figure 1:
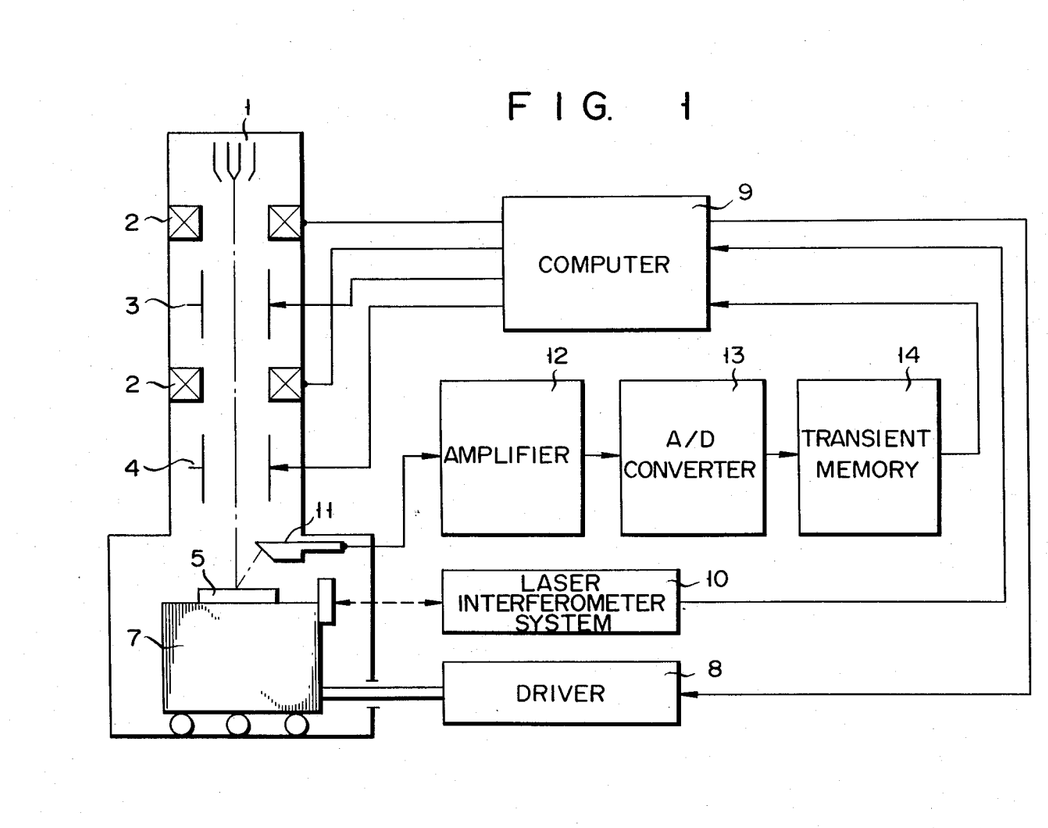
FIG. 1 is a block diagram showing an overall electron beam exposure apparatus for executing a method of positioning a specific area on a semiconductor wafer at a location on the semiconductor wafer, which is required in an optical system of a semiconductor manufacturing apparatus, which is an embodiment of the present invention.
Figure 2:
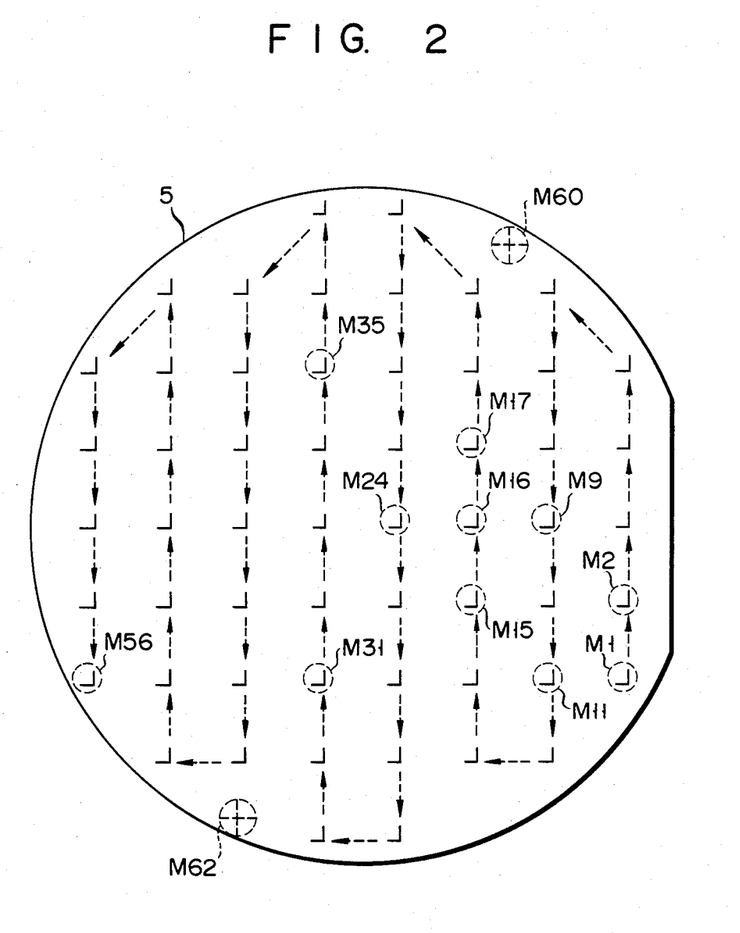
FIG. 2 shows a plan view of a semiconductor wafer bearing a matrix array of positioning marks formed thereon.

One embodiment of the present invention may be described as follows, with reference to figures. A method of positioning a specific (processed) area of a semiconductor wafer at a predetermined positions is required in a semiconductor manufacturing system. In this embodiment, the present invention is applied to a positioning process for an electron beam exposure. An electron beam exposure apparatus shown in FIG. 1 is used for applying an electron beam exposure to a semiconductor wafer 5. Electron beams are emitted by an electron gun 1 and focused by electromagnetic lenses 2. The electron beams are deflected by a combination of a blanking deflection plate 3 and a scanning deflection plate 4, and are projected onto the semiconductor wafer 5 placed on a table 7. The table 7 is moved by a driver 8 in an X direction or horizontal direction on the drawing and a Y direction or an obverse and reverse direction on the drawing. The driver 8 is driven by commands issued from a computer 9. Positions of the table 7 in the X and Y directions are accurately measured by a laser interferometer system 10. The voltages applied to the deflection plates 3 and 4 are also controlled by the computer 9. The electron beams reflected by the semiconductor wafer 5 are detected by an electron detector 11. Upon receipt of the reflected electron beams, the electron detector 11 produces a signal based on the amount of the reflected electrons. The detected signal is amplified by an amplifier 12 and is converted by an A/D converter 13 into a digital signal. The digital signal output from the A/D converter 13 is stored in a transient memory 14. The computer 9 computes position data of a mark on the semiconductor wafer 5 using the table position based on the output signal of the laser range finder 10, the voltages applied to the deflection plates 3, which represent an amount of deflection of electron beam, and the data stored in the transient memory 14. A matrix of L-shaped positioning marks are disposed on the semiconductor wafer 5, as shown in FIG. 2. Positioning marks are formed lying on dicing lines of the semiconductor chips. Those marks are formed by an anisotropic etching of silicon. The marks are numbered M1-M56 in the order shown by the direction of an arrow with a broken line for the purpose of explanation.

Figure 3A:
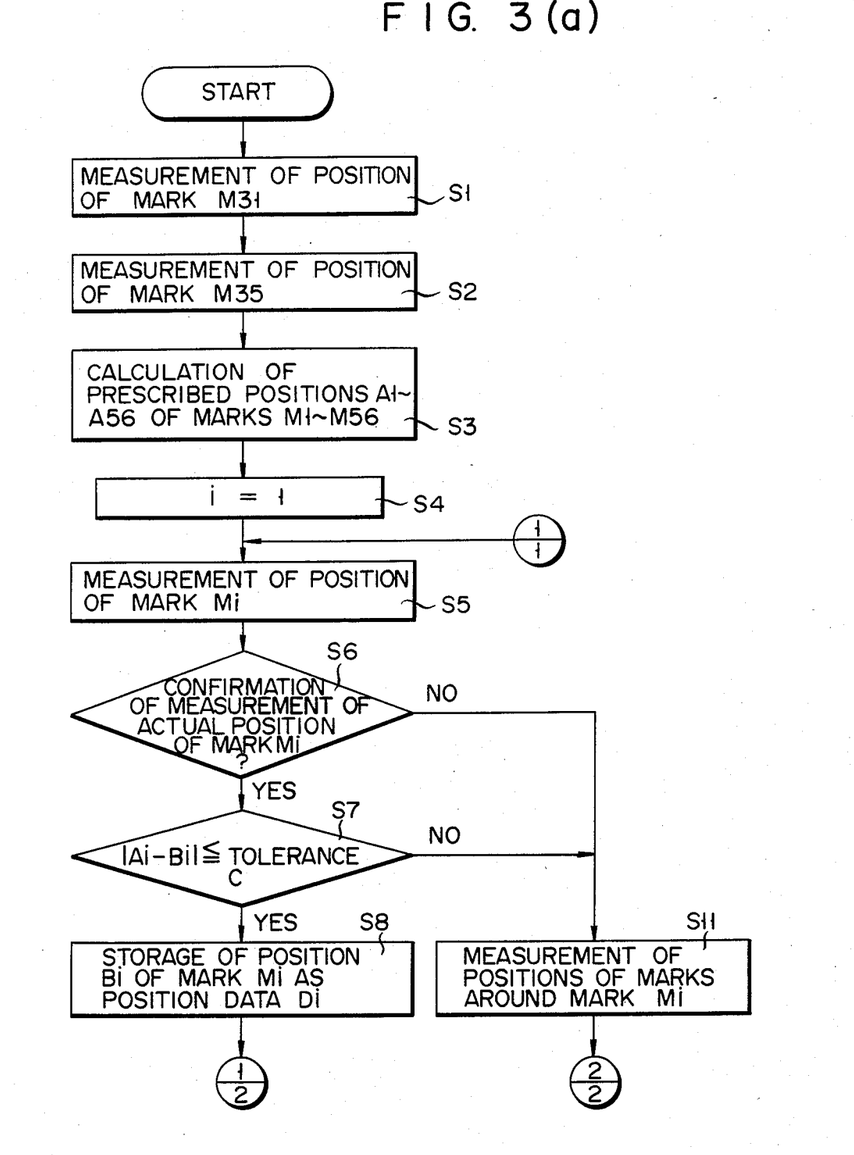
FIGS. 3(a) and 3(b) cooperate to show a flow chart for explaining the positioning method according to the present invention.
Figure 3B:
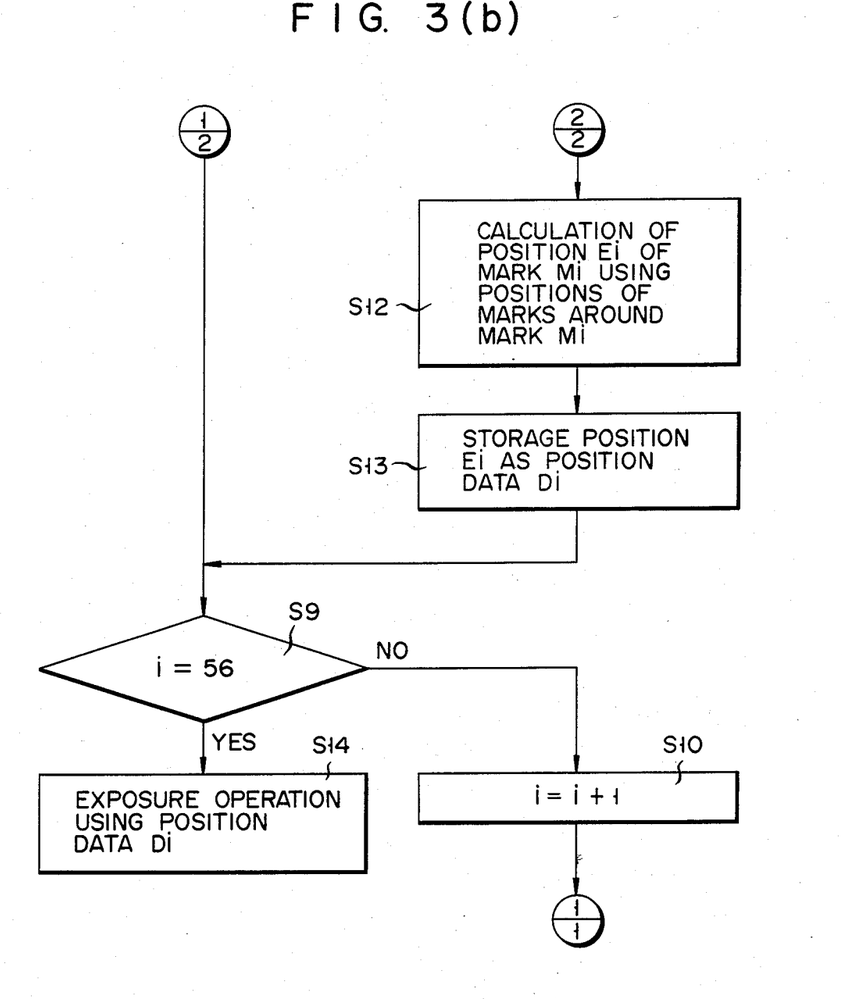
Figure 4:
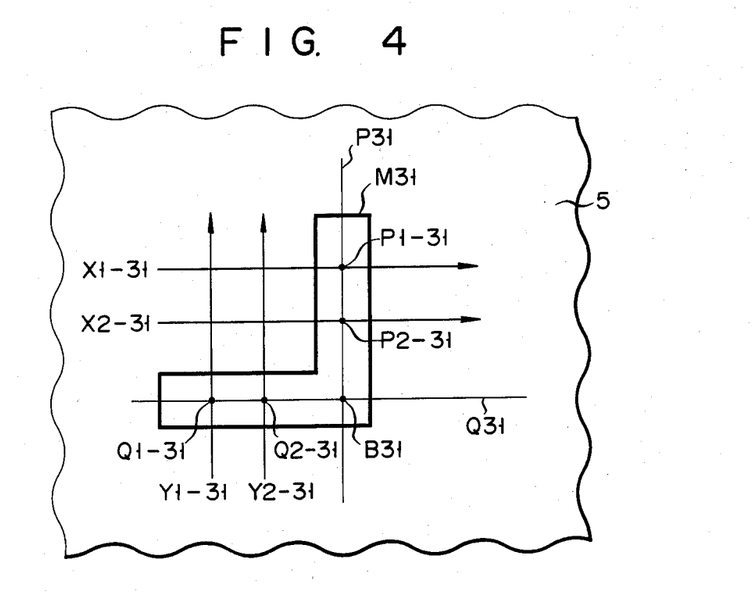
FIG. 4 is a plan view showing a method for measuring a positioning mark.
Figure 5:
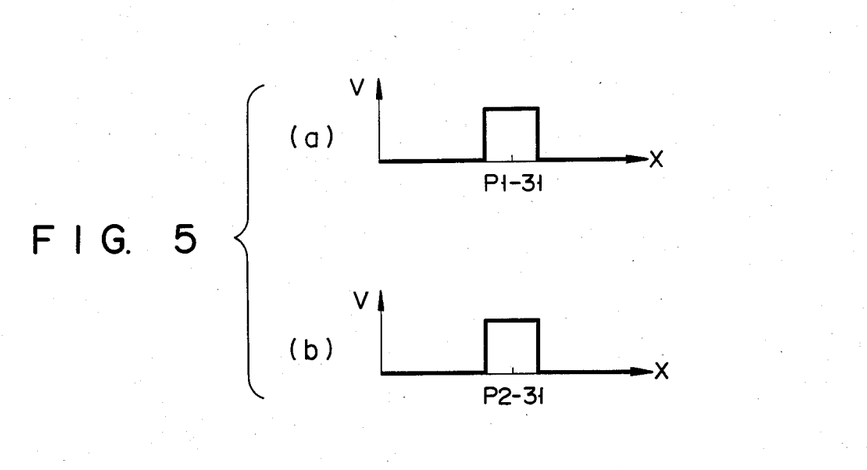
FIGS. 5(a) and 5(b) show signal waves obtained when the wafer is scanned at two different positions by an electron beam in a horizontal directions as viewed in the drawing.

How to apply an electron exposure to the semiconductor wafer 5 using the electron beam exposure apparatus will be described referring to FIGS. 3(a) and 3(b) illustrating a flow chart. As a first step S1, a position of a mark M31, for example, which is properly selected from the marks M1-M56, is measured (found). The position of the mark M31 is expressed in the terms of the x- and y-coordinates, for example. The position measurement of the mark M31 is performed in the following manner. The table 7 is moved to a position allowing the position of the mark M31 to be measured. As shown in FIG. 4, the electron beam is moved for scanning the wafer along the lines X1-31 and X2-31 and in their arrow direction. A waveform, shown in FIG. 5(a) is produced by the A/D converter 13 when the semiconductor wafer is scanned by the electron beam in the direction X1-31. The waveform of the output signal from the A/D converter 13 when the electron beam is moved in the direction X2-31 is shown in FIG. 5(b). Midpoints in the durations of the output signals from the A/D converter 13 are denoted as P1-31 and P2-31, respectively. The center line P31 in the Y direction is obtained using the midpoints P1-31 and P2-31. Similarly, the electron beam is moved in the arrow directions Y1-31 and Y2-31, thereby to obtain the points Q1-31 and Q2-31. Further, using these points Q1-31 and Q2-31, a center line Q31 in the X direction is obtained. An intersection B31 of the center lines P31 and Q31 is used as a position of the mark M31.

In the step S2, the position of a mark, for example, M35, selected from the marks M1-M56 is measured. In step S3, the positions (prescribed positions) A1-A56 of the marks M1-M56 arrayed in a matrix are calculated from positions of the marks M31 and M35 in the same way as in step 1.

Figure 6:
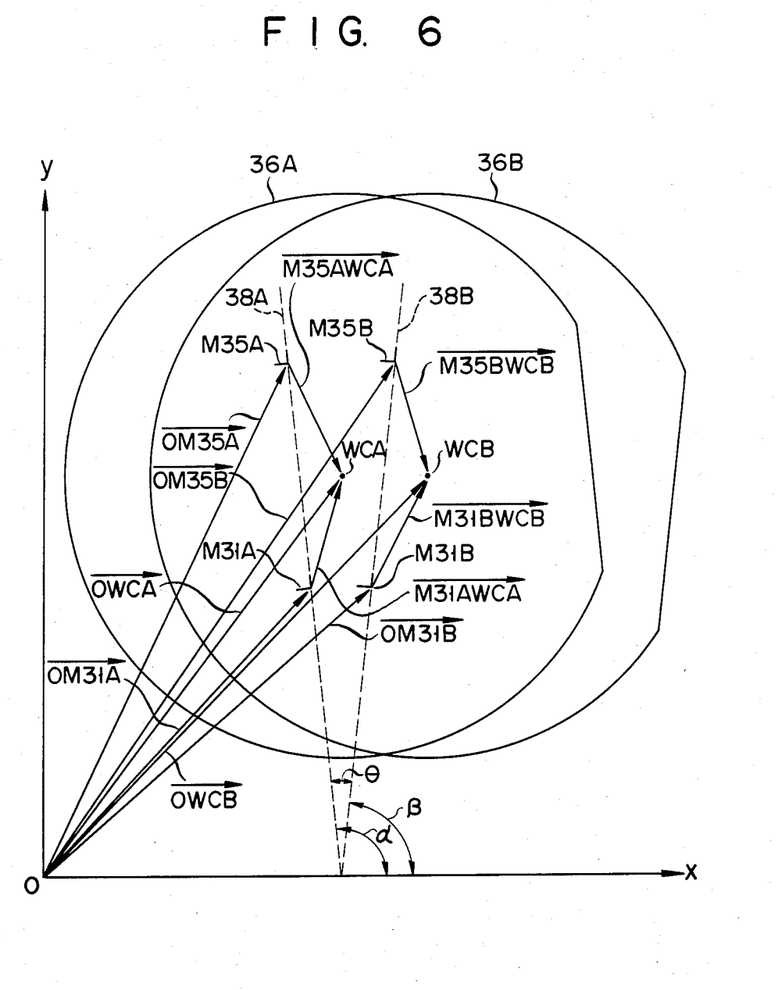
FIG. 6 is a diagram illustrating how to calculate the prescribed positions of the positioning marks.

With reference to FIG. 6 it will be explained how to calculate the prescribed positions A1-A56. In FIG. 6, the X-axis and Y-axis are the reference ordinates of the electron beam exposure apparatus. "36A" is an imaginary semiconductor wafer placed at a certain position with respect to the X- and Y-axis. "36B" is a semiconductor wafer placed in the apparatus. The wafer 36B is displaced from the wafer 36A and rotated. For explanation's sake, let "MiA" represent the i-th mark Mi formed on the imaginary wafer 36A, and let "WCA" denote the center of the imaginary wafer 36A. For the same purpose, "MiB" is used to designate the i-th mark Mi of the wafer 36B, and "WCB" is used to denote the center of the wafer 36B. The angle $\alpha$ defined by the X-axis and a broken line 38A passing the marks M35A and M31A is obtained from the demensions of the apparatus and those of the wafer 36A. Then, the angle $\beta$ defined by the X-axis and a broken line 38B passing the marks M35B and M31B is determined from the positions of these marks which have been measured in steps S1, S2. The coordinates of these marks are given as follows:

$\overrightarrow{OM31A}$ (M31Ax, M31Ay)
$\overrightarrow{OM35A}$ (M35Ax, M35Ay)
$\overrightarrow{OM31B}$ (M31Bx, M31By)
$\overrightarrow{OM35B}$ (M35Bx, M35By)

The above-mentioned angles $\alpha$, $\beta$ are represented as follows:

$$\alpha = \tan^{-1}\left(\frac{M35Ay - M31Ay}{M35Ax - M31Ax}\right)$$

$$\beta = \tan^{-1}\left(\frac{M35By - M31By}{M35Bx - M31Bx}\right)$$

Here, let "$\theta$" denote "$\beta - \alpha$". Then, the rotational displacement $R(\theta)$ of the position vector is given as follows:

$$R(\theta) = \begin{pmatrix} \cos\theta & \sin\theta \\ -\sin\theta & \cos\theta \end{pmatrix}$$

The position of the center WCB of the wafer 36B is then determined. First, the vectors $\overrightarrow{M35AWCA}$ and $\overrightarrow{M31AWCA}$ which connect the marks M35A, M31A and the center WCA are calculated. And vectors $\overrightarrow{OWCB31}$ and $\overrightarrow{OWCB35}$ are given as follows:

$$\overrightarrow{OWCB31} = \overrightarrow{OM31B} + R(\theta)\overrightarrow{M31AWCA}$$

$$\overrightarrow{OWCB35} = \overrightarrow{OM35B} + R(\theta)\overrightarrow{M35AWCA}$$

When the positions of the marks M31B and M35B are accurately measured and the distance between these marks is accurately calculated, $\overrightarrow{OWCB31}=\overrightarrow{OWCB35}=\overrightarrow{OWCB}$. This is an ideal case and can hardly be expected. In practice, vector $\overrightarrow{OWCB31}$ slightly differs from vector $\overrightarrow{OWCB35}$. Normally, therefore, the position of the center WC is obtained by taking the mean value of vectors $\overrightarrow{OWCB31}$ and $\overrightarrow{OWCB35}$. (Vectors $\overrightarrow{OWCB31}$, $\overrightarrow{OWCB35}$ and $\overrightarrow{OWCB}$, when illustrated in a drawing as in FIG. 6, substantially overlap one another, so that $\overrightarrow{OWCB31}$ and $\overrightarrow{OWCB35}$ are not show for the sake of simplicity.)

The position of the center WCB is represented as follows:

$$\overrightarrow{OWCB} = \frac{1}{2}\left(\overrightarrow{OWCB31} + \overrightarrow{OWCB35}\right)$$

Thereafter, the prescribed positions A1–A56 are calculated from the positions of the marks M1A–M56A formed on the imaginary wafer 36A.

The prescribed position Ai of the i-th mark MiB is given as follows:

$$\overrightarrow{OAi} = \overrightarrow{OWCB} + R(\theta)\overrightarrow{WCAMi}$$

In step S4, a pointer is set at 1. In the next step S5, an actual position Bi of the ith mark is measured. In this specification, i=1 for simplicity of explanation. In step S6, it is judged whether the position B1 of the mark M1 is actually measured. When the position B1 of the mark M1 is measured, the control flows to step S7. In step S7, the position A1 of the mark M1 worked out in step S3 is compared with the actual position B1 of the mark M1. When a difference |A1- B1| between the absolute values of the positions A1 and B1 is below a predetermined tolerance C, the control advances to a step S8. In this step S8, the computer 9 stores the actual position B1 of the mark M1 as obtained in step S5 in the form of the position data D1 of the mark M1. In step S9, the computer 9 checks whether the measurement of all of the mark positions is completed. If there are still marks to be measured, that is, i is not 56, the control goes to step S10. In this step, the pointer is incremented by one. Then, the control returns to step S5. Then, the sequence of the steps as mentioned above are performed with respect to the mark M(i+1), M2 in this example. Subsequently, the processing on the remaining marks is performed in the order of the arrow direction in FIG. 2.

Figures 7, 8:
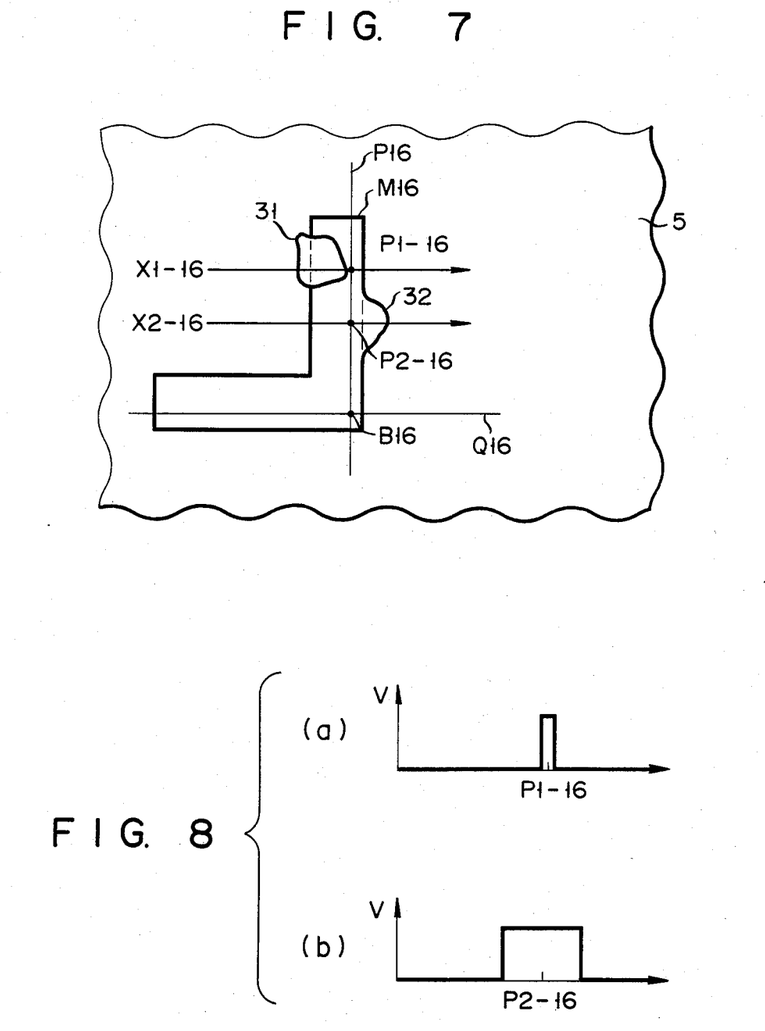
FIG. 7 shows a plan view of a defective mark on the semiconductor wafer.

Let us assume that the mark M16 in FIG. 2 is defective. The defective mark involves, for example, the following two cases: (a) the mark M16 is not present, so that the measurement of it is impossible, and (b) dust 31 is stuck to the mark M16 or the mark M16 has a projection 32, as shown in FIG. 7. Further, a mark M16 is dislocated from its correct position. In such cases, the position B16 of the mark M16 has an incorrect value. FIG. 8(a) shows a waveform of the output signal from the A/D converter 13 when the semiconductor wafer is scanned by an electron beam in the arrow direction X1-16. And point P1-16 indicates the middle of an interval during which the output signal of A/D converter 13, obtained by this scanning, is at a high level. This operation is made in the step S5. FIG. 8(b) shows a waveform of the output signal of the A/D converter 13 when the semiconductor wafer is scanned in the arrow direction X2-16. And point P2-16 indicates the middle of an interval during which the output signal of A/D converter 13, obtained by this scanning, is at a high level. A center line P16 is obtained using these signals. Similarly, a center line Q16 in the X direction is obtained. An intersection of the center lines P16 and Q16 provides a position of the mark M16. In such cases, even if the mark is at a correct position, the position B16 of the mark M16 is erroneously measured. This is true also in the case where the mark M16 is formed at an incorrect position. In the case (a), the position B16 of the mark M16 is not measured in step S5. Accordingly, in step S6, the position of the mark M16 could not be measured, and the control jumps to step S11. In the case (b), the position B16 is measured in step S5. The control jumps step S6 to step S7. In step S7, the predicted position A16 as calculated in step S3 is compared with the actual position B16 as actually measured in step S5. If an absolute value of a difference between the predicted position A16 and the actual position B16 is below the tolerance C, the control goes to step S8, as mentioned above. On the other hand, if the difference is above the tolerance C, the control jumps to step S11. The control jumps to step S11 means that the mark M16 is defective. In step S11, the computer 9 measures the positions of the marks around the mark M16, for example, M9, M15, M17, and M24. In step S12 the computer 9 calculates the position E16 of the mark M16 using the positions of those marks, for example, by an interpolation method. In step S13, the computer 9 stores the position E16 thus obtained in the form of position data D16 of the mark M16. Then, the control advances to step S9. In this step, if it is judged that the measurement of the mark positions is not yet completed, the control progresses to step S10. In this step S10, the pointer is incremented by one. Then, the control returns to step S5 where the position of each of the remaining marks is measured. When the position measurement of the marks on the semiconductor wafer is completed, the control goes to step S14. In this step, the computer 9 performs an electron beam exposure on the semiconductor wafer using the position data D1–D56 obtained in steps S8 (the mark is not defective) or S13 (the mark is defective). Specifically, before the scanning operation begins, the computer 9 corrects the deflection start position of the electron beam using the actual position of the mark as measured in step S4 for the defective mark and the calculated position as calculated in step S13. A distortion of the semiconductor wafer due to the fabricating process is usually 0.5 μm or less. Therefore, if the tolerance C is set at 0.5 μm, the mark position can be obtained with an accuracy of 0.5 μm or less.

In the above-mentioned embodiment, the position Bi of the ith mark Mi is measured, and then the sequence of steps S6–S10 and steps S11–S13 are executed. Then, the (i+1)th mark position is measured. Alternatively, the actual positions B1–B56 of all of the marks M1–M56 may be previously measured. In this case, subsequently, the operations succeeding to step S6 are performed.

The marks used for calculating the prescribed positions A1–A56 on the semiconductor wafer are not limited to those of M31 and M35. The number of marks is not limited to two, but may be selected to be a proper number if necessary. Further, these marks are not limited to those arrayed on dicing lines in a matrix fashion, but may be those arrayed on other places than the dicing lines and in other fashions than the matrix, for example, marks M60, M62 denoted by broken lines in FIG. 2.

The marks M9, M15, M17 and M24 used for obtaining the position E16 of the mark M16 may be replaced by other proper marks. For example, for obtaining the position of the mark M1, the marks M2 and M11 may be used.

Figure 9:
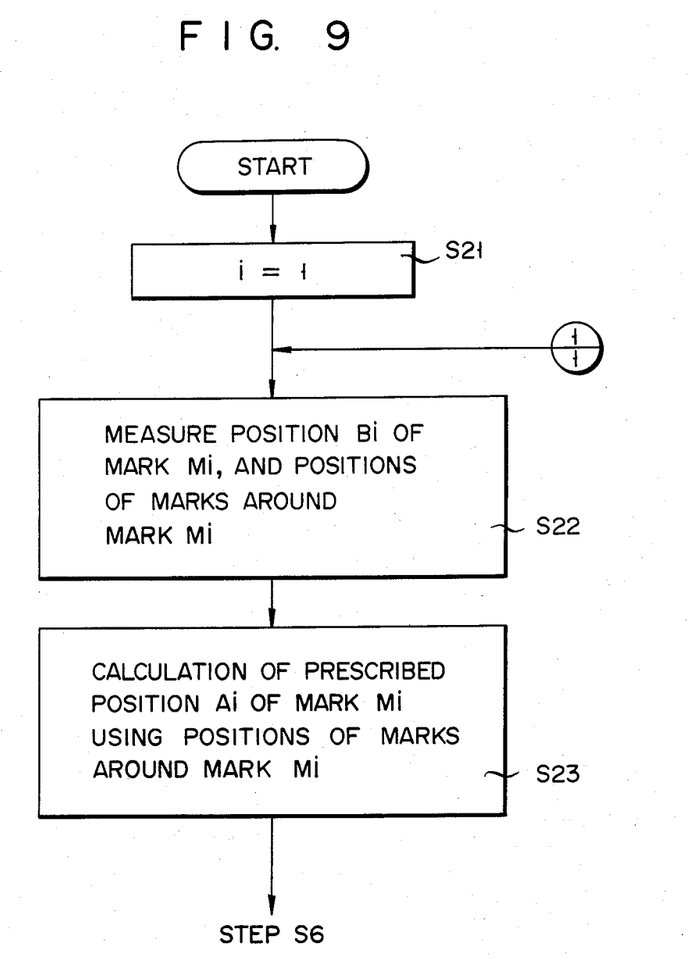
FIG. 9 shows a flow chart for explaining another embodiment of the present invention.

In the above-mentioned embodiment, the marks M31 and M35, as obtained in the steps S1 and S2, are used for calculating the positions A1-A56 in step S3. This may be modified as shown in a flow chart shown in FIG. 9. In step S21, a pointer is set at 1. In step S22, the position Bi of the ith mark Mi is measured and, at this time, the positions of the marks around the mark Mi are measured. In step S23, the predicted position Ai of the mark Mi is calcuated using the positions of those peripheral marks of the mark Mi, as measured in step S22. Then, the sequence of steps are performed succeeding to step S6 in the flow chart shown in FIG. 3(a) and 3(b). In this case, step S7 is used for comparing the position Bi of the mark Mi with the prescribed position Ai calculated on the positions of the peripheral marks. Therefore, the tolerance C may be set at 0.1 μm. The prescribed position Ai may be used for the position Ei obtained in step S13. The method of positioning the semiconductor wafer on the basis of the mark position data enables the semiconductor wafer to be exposed to the electron beam at a high accuracy. Also in the flow chart of FIG. 9, the calculation of the prescribed positions A1-A56 may follow the measurement of the actual position B1-B56 of all of the marks M1-M56.

Further, the shape of a mark may be a cross mark in place of the L-shaped mark. The position data Di of the mark Mi is applicable not only for the electron beam exposure, but also ion implantation method.

What is claimed is:

1. A method of positioning a beam to a specific portion of a semiconductor wafer having a plurality of positioning marks formed thereon to treat the wafer, comprising the steps of:
   a first step of detecting the positions of at least two predetermined positioning marks by radiating a beam thereto, calculating a first position of each of said plurality of position marks from the detected positions of said at least two predetermined marks and detecting an actual position of each of said plurality of position marks by radiating the beam thereto;
   a second step of determining if each of selected ones of said marks satisfies predetermined conditions;
   a third step of using the actual position of those of said selected marks which satisfy the predetermined conditions as the reference position to position the beam to a specified portion of the wafer; and
   a fourth step of providing for each of those of said selected marks which do not satisify the predetermined conditions a second position wherein said second position is calculated from the positions of marks around each of those of said selected marks which do not satisify the predetermined conditions whereby said second position is used as the reference position in order to position the beam to the specific portion of the wafer.

2. A method according to claim 1, wherein the first step comprises:
   a first substep of detecting the positions of two predetermined marks by radiating the beam thereto;
   a second substep of calculating the first position of each of said marks from the positions detected in the first substep; and
   a third substep of detecting the actual position of the selected mark by radiating the beam thereto.

3. A method according to claim 1, wherein the first step comprises:
   a first substep of detecting the actual position of each of said marks by radiating the beam thereto;
   a second substep of detecting the positions of two predetermined marks by radiating the beam thereto; and
   a third substep of calculating the first position of the selected mark from the positions detected in the second substep.

4. A method according to claim 1, wherein the positioning marks are arranged in the form of a matrix on the semiconductor wafer.

5. A method according to claim 1, wherein some of the positioning marks are arranged in the form of a matrix on the semiconductor wafer and the remaining position marks are arranged thereon in an irregular pattern, and in the first step the positions of two predetermined marks arranged in an irregular pattern are detected, the first position of each of said marks arranged in the form of a matrix is calculated from the detected positions of the two predetermined marks, and the actual positions of each of selected ones of said marks arranged in the form of a matrix is detected.

6. A method according to claim 1, wherein some of the positioning marks are arranged in the form of a matrix on the semiconductor wafer, and in the first step, the positions of at least two predetermined marks around the each selected mark arranged in the form of a matrix are detected, the first position of each selected mark calculated from the detected positions of the two predetermined marks and the actual position of each selected mark are detected, and in said fourth step the first position is used as the reference position when the selected mark has been determined in the second step not to satisfy the conditions.

7. The method according to claim 1, further comprising a step for executing an electron beam exposure using the position of the selected mark which is considered as a reference in either of said third or fourth step.

8. A method according to claim 1, wherein the second step comprises a first substep of determining if the actual position of each selected mark has been detected in the first step and determining that the selected mark does not satisfy the predetermined conditions, when the position of the selected mark has not been detected; a second substep of detecting the difference between the calculated position and actual position of the selected mark both obtained in the first step when it is determined that the actual position has been detected in the first substep; and a third substep of determining that the selected mark does not satisfy the predetermined conditions, when the absolute value of the difference detected in the second substep is greater than a predetermined value, and determining that the actual position of the selected mark satisfies the predetermined conditions, when the absolute value of the difference is less than the predetermined value.

9. A method according to claim 8, wherein the predetermined value is 0.5 micron.

10. A method according to claim 8, wherein the predetermined value is 0.1 micron.

* * * * *